(12) United States Patent  
O'Hara et al.

(10) Patent No.: US 7,672,750 B2  
(45) Date of Patent: Mar. 2, 2010

(54) METHOD AND APPARATUS FOR MONITORING A MICROSTRUCTURE ETCHING PROCESS

(75) Inventors: Anthony O'Hara, Livingston (GB); Michael Leavy, Livingston (GB); Graeme Pringle, Livingston (GB)

(73) Assignee: Point 35 Microstructures Ltd., Livingston (GB)

( * ) Notice: Subject to any disclaimer, the term of this patent is extended or adjusted under 35 U.S.C. 154(b) by 38 days.

(21) Appl. No.: 11/814,247

(22) PCT Filed: Jan. 17, 2006

(86) PCT No.: PCT/GB2006/000140

§ 371 (c)(1),  
(2), (4) Date: Dec. 17, 2007

(87) PCT Pub. No.: WO2006/077390

PCT Pub. Date: Jul. 27, 2006

(65) Prior Publication Data

US 2008/0147229 A1    Jun. 19, 2008

(30) Foreign Application Priority Data

Jan. 18, 2005    (GB) ................................. 0500980.8

(51) Int. Cl.  
*G06F 19/00* (2006.01)  
*G05B 11/01* (2006.01)  
*B29C 47/00* (2006.01)  
*C23F 1/00* (2006.01)  
*H01L 21/306* (2006.01)

(52) U.S. Cl. .......................... 700/121; 700/12; 700/117; 156/244.26; 156/345.24; 156/345.27; 216/57; 216/58; 216/59

(58) Field of Classification Search ................... 700/12, 700/117, 121; 156/244.26, 345.24, 345.27; 216/57–59

See application file for complete search history.

(56) References Cited

U.S. PATENT DOCUMENTS

| 4,913,790 | A |   | 4/1990  | Narita et al. |
| 4,971,653 | A |   | 11/1990 | Powell et al. |
| 5,200,023 | A | * | 4/1993  | Gifford et al. .................. 216/59 |
| 5,645,683 | A | * | 7/1997  | Miyamoto .................. 438/714 |
| 5,846,373 | A | * | 12/1998 | Pirkle et al. ............ 156/345.25 |
| 5,948,283 | A |   | 9/1999  | Grosshart et al. |

(Continued)

FOREIGN PATENT DOCUMENTS

JP    59025227 A    2/1984  
JP    06124916 A    5/1994

*Primary Examiner*—Ramesh B Patel  
(74) *Attorney, Agent, or Firm*—Heslin Rothenberg Farley & Mesiti P.C.; Victor A. Cardona, Esq.

(57) ABSTRACT

An etching monitoring apparatus and related method for use in the manufacture of microstructures (and in particular MEMS) located within an etching chamber is described. The apparatus and related method operates by setting the temperature of the chamber within which the microstructure is located at a starting temperature, and maintaining the partial pressure of an etching gas within the chamber at a constant value. As a result the surface temperature of the micro structure within the chamber is primarily determined by the etch rate. Therefore, by employing a thermometer to monitor the change in etching surface temperature, a direct diagnostic for monitoring the etching process is provided.

29 Claims, 2 Drawing Sheets

U.S. PATENT DOCUMENTS

| | | | |
|---|---|---|---|
| 6,632,321 B2 * | 10/2003 | Lill et al. | 156/345.24 |
| 6,837,965 B2 * | 1/2005 | Gustafson et al. | 156/345.25 |
| 7,306,696 B2 * | 12/2007 | Lian et al. | 156/345.25 |
| 2003/0029834 A1 * | 2/2003 | Lill et al. | 216/59 |
| 2004/0060659 A1 * | 4/2004 | Morioka et al. | 156/345.26 |
| 2004/0191932 A1 * | 9/2004 | Fuse | 438/9 |
| 2005/0130330 A1 * | 6/2005 | Gustafson et al. | 438/5 |
| 2006/0249481 A1 * | 11/2006 | Fuse | 216/67 |

* cited by examiner

METHOD AND APPARATUS FOR MONITORING A MICROSTRUCTURE ETCHING PROCESS

CROSS REFERENCE TO RELATED APPLICATIONS

This application is a national stage of PCT International Application No. PCT/GB2006/00140, filed on Jan. 17, 2006, and published in English on Jul. 27, 2006, as WO 2006/077390 A1, which claims priority to Great Britain Application No. 0500980.8 filed on Jan. 18, 2005, the entire disclosures of which are incorporated herein by reference.

The present invention relates to a method and apparatus for use in the manufacturing of microstructures. Typically, the microstructures are in the form of micro electromechanical systems (MEMS) that require the removal of a material relative to a substrate or other deposited material. In particular, this invention relates to an improved method and apparatus for control of the gas phase etching process involved in the manufacture of these microstructures.

The manufacture of MEMS or semiconductor devices is known by those skilled in the art to involve the depositing and etching of one or more materials so as to create various structures. To create these devices in the form of integrated circuits, MEMS components or flat panel displays, a substrate (e.g. a wafer or a glass panel) is typically processed within a processing chamber. This processing may include the deposition of layers of materials (e.g. polysilicon, silicon dioxide, etc) on the substrate followed by the selective etching of the deposited layers.

To prepare the layers for etching, the substrate surface is typically masked with an appropriate photoresist or hard mask. During etching, an appropriate source gas is employed to etch through regions unprotected by the mask. The etching is terminated once it is determined that the removal of the target material has been completed. This termination of the etching is typically referred to as the "etch endpoint".

With particular reference to the processing of MEMS, the etch processes are typically based on a sacrificial etch approach where a sacrificial material is used to shape and support a structure during construction. With the structure complete the sacrificial material is then removed by etching.

As the etch proceeds, the etch material is consumed according to a chemical and/or physical reaction being employed. At the point where the etch material is completely consumed the etch process has ended, i.e. the aforementioned etch endpoint. Many techniques have been employed to monitor the etch process and to determine the etch endpoint, mainly based on optical techniques, pressure monitoring and gas analysis. For example, optical techniques have been employed in a number of different methods to monitor the etch process. One example comprises illuminating a series of lines being etched with laser light so as to produce an interference pattern in reflection. The resultant interference pattern is dependent on the structure including the depth of the channel and therefore is indicative of the progress of the etch.

In plasma systems the atoms in the chamber are excited and, as they relax back, light is produced. The wavelength of the emitted light is primarily dependent on the gas species present in the chamber. Filtering the emitted light for a set wavelength corresponding to an appropriate gas produced as a by-product of the etch allows the etch to be monitored.

Some etch reactions increase or decrease the molar concentration within the chamber, thus increasing or decreasing the pressure within the chamber. Again any changes indicates the progress of the etch and as the chamber pressure levels out the etch endpoint can be determined.

Monitoring the gas species in the chamber also allows the etch process to be observed. The gas can be determined by using an instrument such as Residual Gas Analyser (RGA).

In many MEMS processing procedures, a Xenon Difluoride ($XeF_2$) source gas is employed to etch sacrificial silicon as part of the release procedure. $XeF_2$ is known to etch silicon isotropically and spontaneously in the vapour phase without the requirement for external energy input. The isotropic nature of the etch offers the advantage that large structures can be undercut. The use of $XeF_2$ to etch sacrificial silicon has additional advantages, primarily that $XeF_2$ is highly selective to silicon with respect to aluminium, photoresist and Silicon Dioxide ($SiO_2$). This selectivity rate can be as high as 1000:1. Additionally, at room temperature the etch rate is high, which makes this process ideal for the release of MEMS structures when using silicon as the sacrificial material.

At room temperature and atmospheric pressure $XeF_2$ is a white crystalline solid. The crystal sizes are determined by the conditions under which solidification takes place. Sublimation takes place at the vapour pressure (~4 Torr at 25° C.) and the gas etches silicon with the primary reaction taking place being:

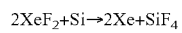
$$2XeF_2 + Si \rightarrow 2Xe + SiF_4$$

This reaction is exothermic; thus as the silicon is etched by $XeF_2$ the temperature of the substrate will increase.

The $XeF_2$ etch rate does not depend on crystal plane, or silicon dopant content. Therefore it is an object of aspects of the present invention to provide an apparatus and method that can accurately and reproducibly monitor and control the gas phase etching process involved in the manufacture of microstructures.

SUMMARY OF INVENTION

According to a first aspect of the present invention there is provided an etching monitoring apparatus suitable for use with an etching chamber the etching monitoring apparatus comprising a pressure controller for controlling a partial pressure of an etching gas, a temperature controller for setting a starting temperature of the etching chamber and a thermometer for monitoring a temperature of a surface of a microstructure to be etched within the chamber.

The temperature of the microstructure is dependent on the starting temperature of the chamber, the chamber pressure and the exothermic etch rate between the etchant and the surface of the microstructure to be etched. By defining a set starting temperature within the chamber and maintaining the chamber at a constant pressure, the surface temperature of the microstructure is thus determined by the etching process. Therefore, measurement of the change in etching surface temperature provides a direct diagnostic for monitoring the etching process. The temperature change is dependent on the etch rate, the higher the change in temperature, the higher the etch rate. For the case where the reaction is exothermic, the etching surface temperature initially increases, before decreasing back to the starting temperature of the chamber, when the etch endpoint is reached.

Most preferably the etching monitoring apparatus further comprises a feedback loop such that the thermometer is employed to regulate the pressure controller. Preferably the feedback loop also allows the thermometer to regulate the temperature controller. The feedback loop is used to respond to the etching monitor such that the etch rate can be controlled to suit the characteristics of the etch requirements.

Preferably the pressure controller, comprises a gas flow controller wherein the gas flow controller provides a means for regulating the flow of the etching gas.

Most preferably the thermometer comprises a non-contact temperature sensor. Preferably the non-contact temperature sensor comprises at least one pyrometer. Alternatively the non-contact temperature sensor is a thermal imaging camera.

Non-contact temperature sensors allow measurement of the temperature of the sample without unduly affecting the etch process. Furthermore, they can be located external to the chamber, thus preventing the likelihood of damage to the thermometer by the etchant gas.

According to a second aspect of the present invention there is provided an etching chamber suitable for etching one or more microstructures comprising an etching monitoring apparatus in accordance with the first aspect of the present invention.

Most preferably the etching chamber comprises a pedestal upon which the microstructure to be etched is located.

Preferably the temperature controller is employed to control the temperature of the pedestal.

Preferably the chamber further comprises a window. Preferably the window is transparent to infra red electromagnetic radiation. Optionally the window is comprises Zinc Selenide. Optionally the chamber further comprises a lid. Optionally the window is located on the lid. Preferably the thermometer is located coincident with the window on the lid.

Zinc Selenide allows thermal electromagnetic or infrared radiation to pass through, which means that locating a non-contact sensor external to the chamber is a practical option. By having a transparent window, the chamber can be otherwise opaque.

According to a third aspect of the present invention there is provided a method of monitoring the progress of an etching process of a microstructure located within an etching chamber, the method comprising the steps of:

1) setting the starting temperature of the chamber;
2) controlling the pressure of an etching gas within the chamber; and
3) monitoring variation in a surface temperature of the microstructure to be etched.

When the starting temperature of the chamber is set and the etchant gas pressure within the chamber is controlled, any variation in the temperature of the etched surface of the microstructure is due to the etch process. Thus, by monitoring the temperature of this sample surface, a diagnostic for the etching process is obtained.

Preferably the step of setting the starting temperature of the chamber comprises setting the temperature of a pedestal upon which the microstructure is located.

Most preferably, the method further comprises the step of comparing the monitored surface temperature with a predetermined standard temperature curve.

When an etch process is well known, it is possible to ascertain generally the temperature variations over time, and subsequently to use this information for comparison purposes.

Optionally the method of monitoring the progress of the etching process further comprises the step of comparing the surface temperature of the microstructure to be etched with the starting temperature so as to determine the etch endpoint.

Preferably the step of monitoring the variation in the surface temperature of the microstructure involves the employment of one or more remote temperature sensors.

The remote temperature sensors may comprise one or more pyrometers ideally located at a distance from the microstructure that coincides with the focal length of the collecting optics of the pyrometer. Alternatively, the remote temperature sensor comprises a thermal imager. This means that instead of the single point measurement afforded by the pyrometer, the temperature can be evaluated over a whole sample surface. This allows the etch to be controlled with regard to the entire sample rather than just one point on the sample.

Preferably the step of controlling the pressure in the chamber comprises maintaining the pressure at a substantially constant value.

Optionally the step of controlling the pressure in the chamber further comprises the step of reducing the partial pressure of the etchant gas in the chamber as the etch process approaches the endpoint. Optionally the step of controlling the pressure in the chamber further comprises the step of controlling the flow of the etching gas into the chamber.

As the etch endpoint is reached, it is often desirable to reduce the pressure of, or reduce the flow of, the etching gas in the chamber to ensure there is no re-crystallisation of the etchant gas in the etch chamber.

BRIEF DESCRIPTION OF DRAWINGS

Aspects and advantages of the present invention will become apparent upon reading the following detailed description and upon reference to the following figures in which.

SPECIFIC DESCRIPTION

Figure 1:
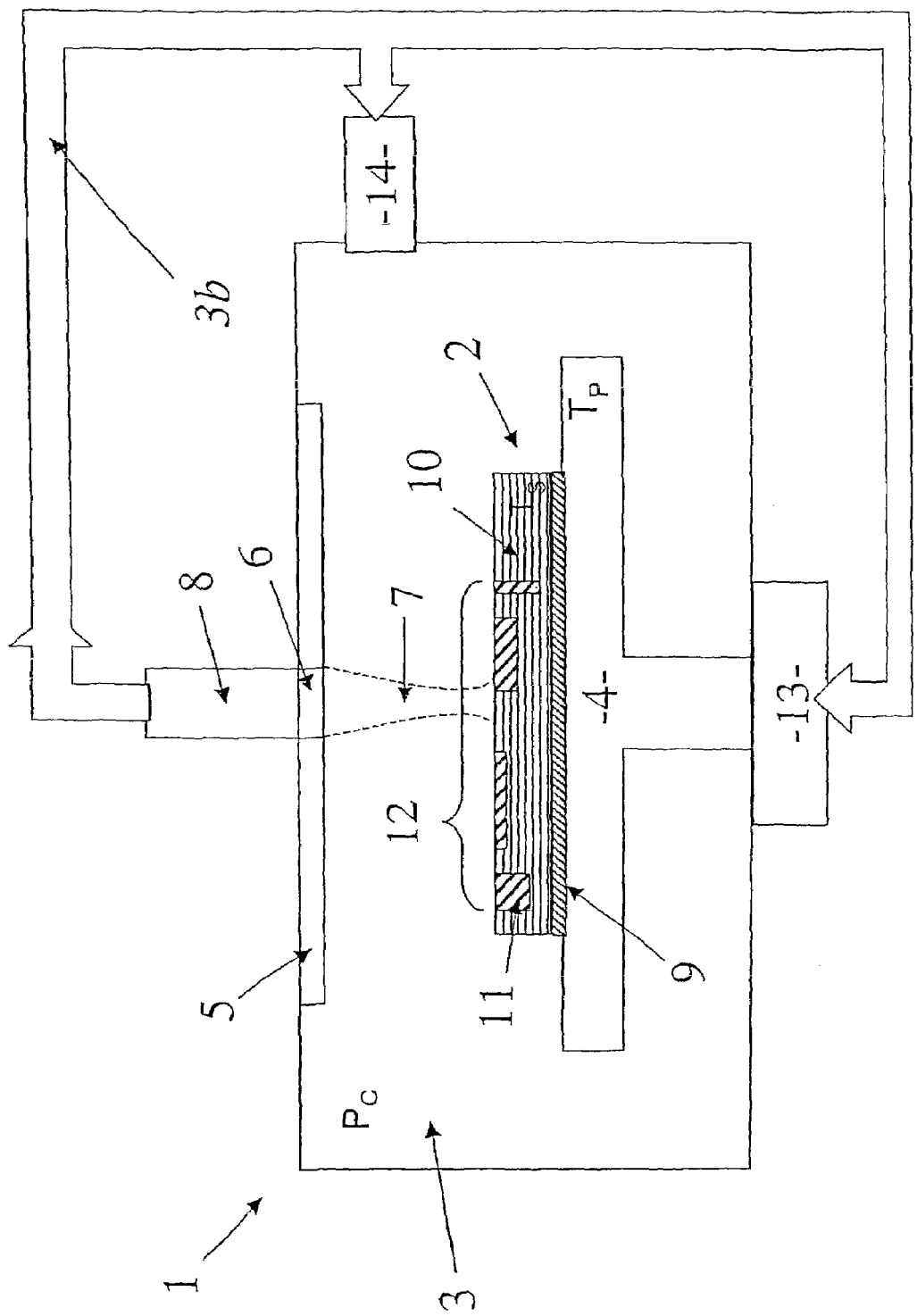
FIG. 1 presents a schematic representation of the apparatus employed for etching a sample in accordance with an aspect of the present invention.

FIG. 1 presents a schematic representation of an etching apparatus 1 employed for etching a microstructure sample 2 in accordance with an aspect of the present invention. The etching apparatus 1 can be seen to comprise an etching chamber 3, that includes a feedback loop 3b, and within which is located a pedestal 4 suitable for locating within the chamber 3 the sample 2 to be etched. The chamber 3 itself can be seen to comprise a lid 5 so as to facilitate user access to the inside of the chamber 3. Located centrally within the lid 5 is a Zinc Selenide (ZnSe) window 6 that provides a means for maintaining the vacuum integrity of the chamber 3 but which permits infrared radiation 7 to be transmitted from within the chamber 3.

The etching apparatus 1 further comprises a pyrometer 8 that is located externally to the chamber 3 and which is coincident with the ZnSe window 6. The pyrometer 8 is located such that the inherent, associated optimal focal length of the pyrometer 8 for maximising the capture of light, coincides with the distance between the pyrometer 8 and the sample 2 located on the pedestal 4. At this optimal operating distance the sensitivity of the pyrometer 8 is maximised. The operating wavelength of the pyrometer 8 is generally 8-12 μm and as such the pyrometer 8 can be employed to monitor the infrared radiation 7 emanating from the chamber 3.

The pyrometer 8 functions on the principle of Planck's law of thermal emission of radiation, which relates the intensity of incandescent radiation (mainly infrared) to temperature and frequency, and thus can determine the temperature of the sample 2 in a non contact fashion by measuring the amount of thermal electromagnetic radiation 7 emitted.

In the particular example of FIG. 1, the sample 2 comprises a substrate 9, upon which layers 10 have been grown. Particularly in MEMS processing, a sacrificial material 11 is used to support and shape a structure 12 during construction with the intention that the sacrificial material 11 can thereafter be etched away so as to leave the sample 2 with a desired structure 12.

The pedestal 4, upon which the sample 2 is located, is set and maintained at a pedestal temperature $T_p$, by a temperature controller 13. This temperature may be above or below room temperature, the particular temperature being selected to optimise the etching process. In addition, the pressure of the etchant gas within the chamber 3, $P_c$, is controlled by a chamber pressure controller 14. The pressure controller 14 may incorporate a gas flow controller employed to provide a means of controlling the flow of gas into the chamber.

For the purposes of illustration, the etchant gas can be considered to be $XeF_2$, and the sacrificial material 11 Silicon. $XeF_2$ is very well suited to the etching of Silicon, given its high selectivity over other materials, as discussed above.

During the etch process, the sample temperature $T_s$ is determined by the pedestal temperature $T_p$, the chamber pressure $P_c$ and the etch rate of the Silicon. The pedestal temperature $T_p$ sets the starting temperature of the sample $T_s$, whereas the chamber pressure $P_c$ influences the thermal contact between the sample 2 and the pedestal 4. By controlling, i.e. maintaining as constant, the gas pressure $P_c$ and the pedestal temperature $T_p$, any change in the temperature of the sample 2 is thus due to the exothermic reaction of the etching.

It will be apparent to those skilled in the art that the chamber 3 may not in fact comprise a pedestal 4 but that the sample to be etched may be located directly on an inner surface of the chamber 3. In such an embodiment the temperature controller 13 sets the starting temperature of the sample $T_s$ by controlling the temperature of the chamber 3, in a similar manner to that described above.

Figure 2:
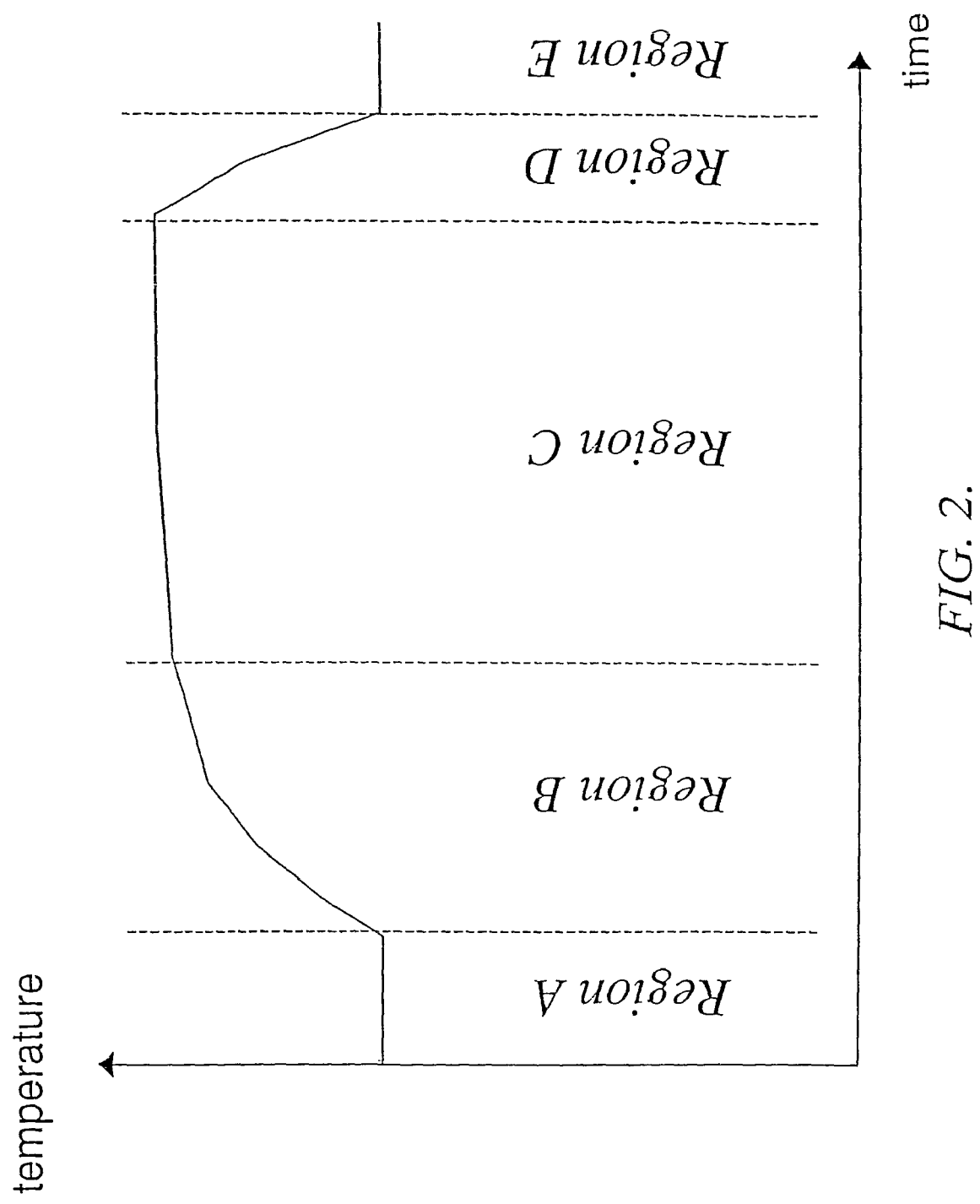
FIG. 2 presents a graph illustrating the behaviour of sample temperature with respect to time during etching of the sample when employing the apparatus of FIG. 1.

Employing the apparatus 1 of FIG. 1 it has been found that a well established etch process exhibits a reproducible characteristic temperature profile, an example of which is illustrated in FIG. 2. Here it can be seen that the temperature of the sample 2 is constant at approximately $T_p$ until etching begins at the end of (region A), and that the temperature gradually increases (region B) to an equilibrium stage (region C) where the heating effect of the exothermic reaction is balanced with the cooling effect of the etching apparatus 1. The sample temperature $T_s$ then drops off as the etch material runs out (region D) and becoming constant again (region E), coincident with the etch endpoint. It is at this point that the supply of $XeF_2$ to the chamber 3 should cease.

This functionality facilitates use of the pyrometer 8 as a diagnostic tool whereby deviations from the characteristic temperature profile may indicate developing problems in the system, for example; loss of chamber pressure, gas blockage or sample degradation.

Furthermore, monitoring the temperature of the sample 2 can provide information on the etch reaction taking place on the sample 2. This information can be used by the feedback loop 3b to enhance control of the etch taking place in the etching chamber 3. For example, the supply of $XeF_2$ can be altered in response to changes picked up by the pyrometer 8. When etching sacrificial material 11; as the Silicon is almost consumed it may be desirable to reduce the flow of $XeF_2$, as in region D of FIG. 2, to ensure there is no re-crystallisation of $XeF_2$ within the etching chamber 3.

It is also found that the etch rate can be dependent on the structure of the sample 2 being etched. In particular, the amount of exposed silicon can influence the etch rate, for a higher exposed silicon a lower etch rate is observed. Thus, the precise temperature profile of an etching process can vary when different structures are being etched.

Also, during the etch of complex structures the amount of exposed silicon may change slowly, or indeed dramatically change, a feature which will again influence the etch rate and which can be detected by the pyrometer 8.

When etching complex structures the etch rate may change as the etch proceeds due to physical changes in the structure being etched. This change in etch rate can be detected by the pyrometer 8 and thereafter related to the characteristics of the feature being etched. For example, a breakthrough step may be employed whereby $XeF_2$ is required to remove a barrier layer in a non-exothermic reaction before making contact with Silicon and beginning the sacrificial etch. This would correspond to the transition between region A and region B in FIG. 2.

In alternative embodiments of the above described methods and apparatus it is found to be beneficial to monitor the temperature of the sample $T_s$ at various sites across the sample. This can provide valuable information on the process control across the sample and so provide feedback to adapt the process to enhance the etch across the sample. One way to achieve this is by using a thermal imager built into the lid 5 instead of the pyrometer 8 so providing a means for viewing the surface of the sample 2. A second approach is to employ an array of pyrometers 8 distributed on the lid 5 so as to provide a means for viewing different points on the sample 2. However, it will be appreciated by those skilled in the art that any technique to measure the temperature of the sample can alternatively be employed.

A third approach would be to use the inherent optical properties of a single pyrometer 8 to integrate the temperature over a given area. The geometry of the pyrometer optics is such that the temperature of the sample 2 at a given point can be measured when it coincides with the focal point of the collecting optics of the pyrometer 8. However, by displacing the sample 2 along the optic axis of the pyrometer 8, the effective measured area is effectively defocused as the sample 2 is displaced from the focal point, resulting in a spot of finite size over which the temperature will be measured as an average.

In general the pyrometer 8 monitors a defined surface area of the sample 2 determined by the optical characteristics of the pyrometer 8 and the collecting optics. The temperature measured is an integration of the temperature over this defined area. Some of the features close to the etch region can be fragile and can be vulnerable to conditions being generated during the etch process. For example, when etching the sacrificial material 11 to leave a membrane the temperature increase can cause an intolerable increase in stress that can damage the membrane. Using the pyrometer 8, the temperature can be monitored and upper limits set to protect the structure. The described monitor can then be employed in a manual or automatic mode to ensure that the etch process does not induce the damaging conditions.

Another example would be encountered when employing an exothermic etch with standard semiconductor circuitry. There is usually a thermal budget for certain structures again limiting the temperature allowed during processing. Again the described monitor can be used to protect the sample during processing.

As discussed, the pyrometer 8 monitors a defined surface and thereafter integrates across the observed temperatures. On very small features the temperature may be much higher than is observed by the pyrometer 8 and so be at damaging level. In order to overcome this problem calibrating experimental results can be taken for a particular structure so as to establish a link between the observed temperature and the actual temperature on these very small features. These test results then be employed to define an observed upper limit temperature so resulting in the protection of the sample during the etch process.

The present invention offers the advantage that the endpoint of an etch process can be accurately determined in an unobtrusive and non-contact manner. Furthermore, the present invention offers a means of accurately and reproducibly monitoring and controlling the gas phase etching process involved in the manufacture of microstructures.

The foregoing description of the invention has been presented for purposes of illustration and description and is not intended to be exhaustive or to limit the invention to the precise form enclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims. For example, it will be appreciated that where silicon and $XeF_2$ have been used to exemplify the system, the system may be used with any substrate material and etch material combination that produces an exothermic or endothermic reaction. In principle this technique can be employed to monitor any reaction which causes a temperature change in the etched sample.

The invention claimed is:

1. An etching monitoring apparatus suitable for use with an etching chamber, the etching monitoring apparatus comprising:
    a pressure controller for controlling a partial pressure of an etching gas;
    a temperature controller for setting a starting temperature of the etching chamber; and
    a thermometer for monitoring a surface temperature of a microstructure being etched within the chamber.

2. The etching monitoring apparatus as claimed in claim 1 further comprising a feedback loop such that the thermometer is employed to regulate the pressure controller.

3. The etching monitoring apparatus as claimed in claim 2 wherein the feedback loop also allows the thermometer to regulate the temperature controller.

4. The etching monitoring apparatus as claimed in claim 1 wherein the pressure controller comprises a gas flow controller such that the gas flow controller provides a means for regulating the flow of the etching gas.

5. The etching monitoring apparatus as claimed in claim 1 wherein the thermometer comprises a non-contact temperature sensor.

6. The etching monitoring apparatus as claimed in claim 5 wherein the non-contact temperature sensor comprises at least one pyrometer.

7. The etching monitoring apparatus as claimed in claim 5 wherein the non-contact temperature sensor is a thermal imaging camera.

8. An etching chamber suitable for etching one or more microstructures comprising an etching monitoring apparatus, the etching monitoring apparatus comprising:
    a pressure controller for controlling a partial pressure of an etching gas;
    a temperature controller for setting a starting temperature of the etching chamber; and
    a thermometer for monitoring a surface temperature of one or more microstructures being etched within the chamber.

9. The etching chamber as claimed in claim 8 wherein the apparatus further comprises a feedback loop such that the thermometer is employed to regulate the pressure controller.

10. The etching chamber as claimed in claim 9 wherein the feedback loop allows the thermometer to regulate the temperature controller.

11. The etching chamber as claimed in claim 8 wherein the pressure controller comprises a gas flow controller such that the gas flow controller provides a means for regulating the flow of the etching gas.

12. The etching chamber as claimed in claim 8 wherein the thermometer comprises a non-contact temperature sensor.

13. The etching chamber as claimed in claim 12 wherein the non contact temperature sensor comprises at least one pyrometer.

14. The etching chamber as claimed in claim 12 wherein the non contact temperature sensor is a thermal imaging camera.

15. The etching chamber as claimed in claim 8 wherein the etching chamber further comprises a pedestal upon which the microstructure to be etched is located.

16. The etching chamber as claimed in claim 8 wherein the etching chamber further comprises a window.

17. The etching chamber as claimed in claim 16 wherein the window is transparent to infra red electromagnetic radiation.

18. The etching chamber as claimed in claim 16 wherein the window comprises Zinc Selenide.

19. The etching chamber as claimed in claims 8 wherein the etching chamber further comprises a lid.

20. The etching chamber as claimed in claim 19 wherein the window is located on the lid.

21. The etching chamber as claimed in claim 20 wherein the thermometer is located coincident with the window on the lid.

22. A method of monitoring the progress of an etching process of a microstructure located within an etching chamber, the method comprising the steps of:
    setting a starting temperature of the chamber;
    controlling the pressure of an etching gas within the chamber;
    monitoring variation in a surface temperature of the microstructure being etched.

23. The method of monitoring the progress of an etching process of a microstructure as claimed in claim 22 wherein the step of setting the starting temperature of the chamber comprises setting the temperature of a pedestal upon which the microstructure is located.

24. The method of monitoring the progress of an etching process of a microstructure as claimed in claim 22 wherein the method further comprises the step of comparing the monitored surface temperature with a predetermined standard temperature curve.

25. The method of monitoring the progress of an etching process of a microstructure as claimed in claim 22 wherein the method further comprises the step of comparing the surface temperature of the microstructure to be etched with the starting temperature so as to determine an etch endpoint.

26. The method of monitoring the progress of an etching process of a microstructure as claimed in claim 25 wherein the step of controlling the pressure in the chamber comprises the step of reducing the partial pressure of the etching gas in the chamber as the etch process approaches the endpoint.

27. The method of monitoring the progress of an etching process of a microstructure as claimed in claim 22 wherein the step of monitoring the variation in the surface temperature of the microstructure involves the employment of one or more remote temperature sensors.

28. The method of monitoring the progress of an etching process of a microstructure as claimed in claim 22 wherein the step of controlling the pressure in the chamber comprises maintaining the pressure at a substantially constant value.

29. The method of monitoring the progress of an etching process of a microstructure as claimed in claim 22 wherein the step of controlling the pressure in the chamber comprises the step of controlling the flow of the etching gas into the chamber.

* * * * *